US007188410B2

(12) United States Patent
Crockett et al.

(10) Patent No.: US 7,188,410 B2
(45) Date of Patent: Mar. 13, 2007

(54) INSERTION OF ELECTRICAL COMPONENT WITHIN A VIA OF A PRINTED CIRCUIT BOARD

(75) Inventors: Timothy Wayne Crockett, Raleigh, NC (US); Harry Thomas Minikel, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 146 days.

(21) Appl. No.: 10/991,064

(22) Filed: Nov. 17, 2004

(65) Prior Publication Data
US 2005/0087366 A1    Apr. 28, 2005

Related U.S. Application Data

(62) Division of application No. 09/775,250, filed on Feb. 1, 2001, now Pat. No. 6,621,012.

(51) Int. Cl.
*H05K 3/30*    (2006.01)

(52) U.S. Cl. .......................... 29/834; 29/832; 29/742; 29/852; 174/262; 361/763

(58) Field of Classification Search ................ 29/825, 29/829–832, 834, 836–847, 852; 174/255, 174/260, 261–263, 267; 228/180.21; 361/760–763, 361/766, 782, 792, 794, 795, 803
See application file for complete search history.

(56) References Cited

U.S. PATENT DOCUMENTS

| 3,078,353 | A | * | 2/1963 | Skelton | 439/43 |
| 3,290,756 | A | * | 12/1966 | Dreyer | 29/832 |
| 3,743,890 | A | * | 7/1973 | Neu | 361/806 |
| 3,784,878 | A | * | 1/1974 | Neu | 361/761 |
| 5,055,966 | A | * | 10/1991 | Smith et al. | 361/321.3 |

\* cited by examiner

*Primary Examiner*—Minh Trinh
*Assistant Examiner*—Donghai D. Nguyen
(74) *Attorney, Agent, or Firm*—Duke W. Yee; Mark E. McBurney; Theodore D. Fay, III (57) ABSTRACT

A printed circuit board and method for reducing the impedance within the reference path and/or saving space within the printed circuit board. In one embodiment of the present invention, a printed circuit board comprises a plurality of conductive layers. The printed circuit board further comprises two or more vias for interconnecting two or more conductive layers. The printed circuit board further comprises an electrical component embedded in a particular via between two conductive layers to reduce the impedance within the reference path and/or save space within the printed circuit board.

10 Claims, 6 Drawing Sheets

INSERTION OF ELECTRICAL COMPONENT WITHIN A VIA OF A PRINTED CIRCUIT BOARD

CROSS-REFERENCE TO RELATED APPLICATIONS

This is a divisional application of application Ser. No. 09/775,250 filed on Feb. 1, 2001, now U.S. Pat. No. 6,621,012 the teachings of which are incorporated herein by reference.

TECHNICAL FIELD

The present invention relates to the field of printed circuit boards, and more particularly to a printed circuit board comprising an internal electrical component positioned within a via of the printed circuit board to suppress impedance and/or save space.

BACKGROUND INFORMATION

A printed circuit board is a board that may hold integrated circuits commonly referred to as chips and other electronic components. Typically, a printed circuit board is made of conductive layers separated by non-conductive dielectric. Conductive pathways commonly referred to as vias may interconnect electrical components on different layers of the board. The vias may be created by drilling through the printed circuit board at the appropriate place where two or more layers will interconnect and allowing conductive material, e.g., copper, to run through the hole. The conductive material, e.g., copper, may coat only the side of the hole or fill the entire hole.

Figure 1:
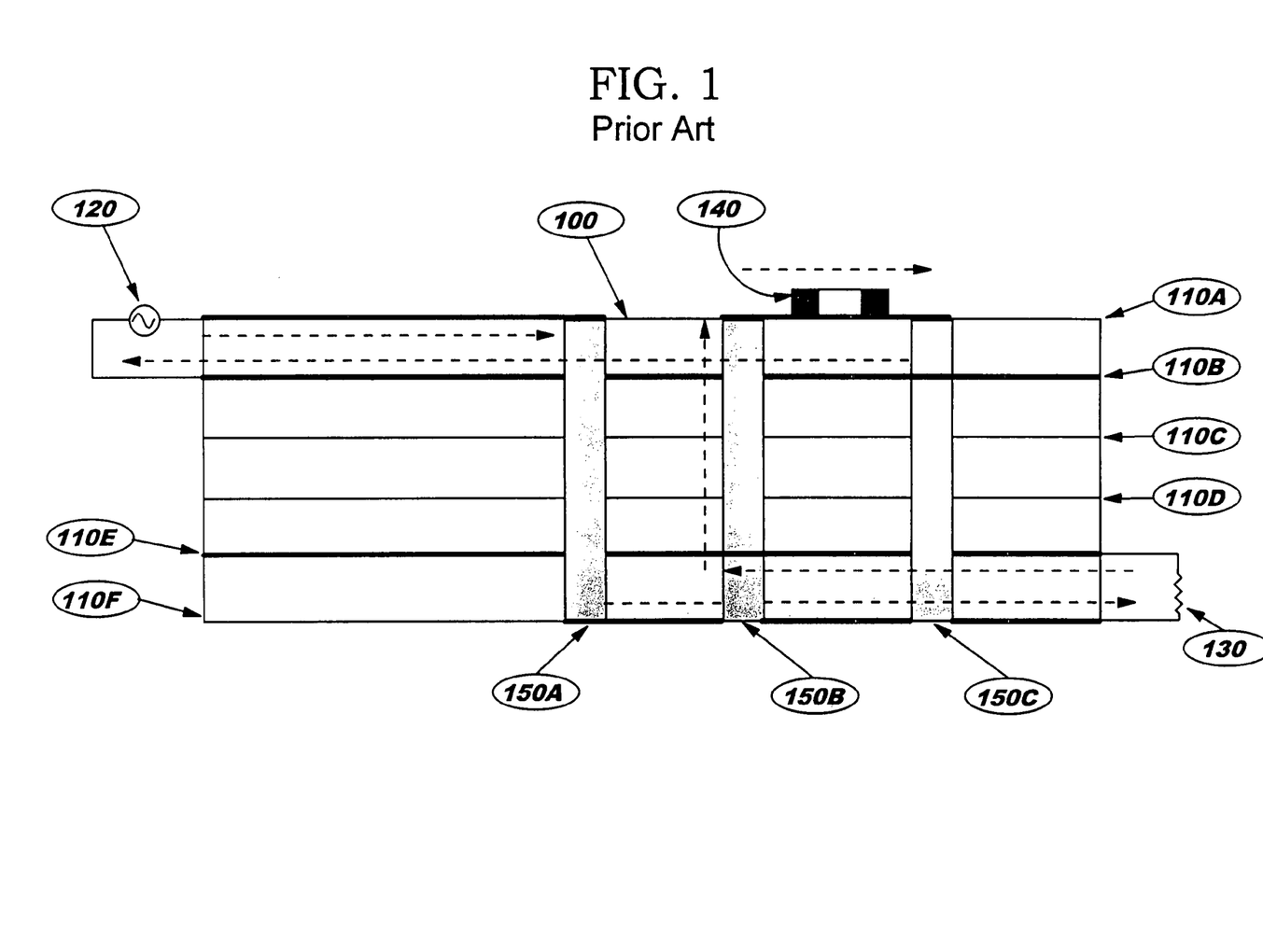
FIG. 1 illustrates a configuration of a printed circuit board with a surface mount capacitor configured to suppress electromagnetic interference.

When high frequency Alternating Current (AC) signals change layers in a printed circuit board, an undesirable electrical disturbance commonly referred to as electromagnetic interference is produced as illustrated in FIG. 1. FIG. 1 illustrates a prior art printed circuit board 100 comprising a plurality of conductive layers 110A–F separated by non-conductive dielectric. Printed circuit board 100 further comprises a plurality of vias 150A–C. Layers 110A–F may collectively or individually be referred to as layers 110 or layer 110, respectively. Vias 150A–C may collectively or individually be referred to as vias 150 or via 150, respectively. As stated above, electromagnetic interference may result when high frequency AC signals change layers in a printed circuit board. For example, an input signal, e.g., high frequency AC signal, may travel along a path commonly referred to as a transmission line from a source 120 to a load 130. The transmission line may be formed from two separate conductive paths. The first conductive path, commonly referred to as the signal path, may be from the etch, i.e., trace, on the top signal layer 110, i.e., layer 110A, of printed circuit board 100 to the etch, i.e., trace, on the bottom signal layer 110, i.e., layer 110F, through via 150A of printed circuit board 100. The second conductive path, commonly referred to as the reference path, may be between the reference layers 110 nearest to the conductive signal path, e.g., path between layers 110E and 110B. As the difference between the impedance of the input signal and reference layers 110, e.g., layers 110B, 110E, increases, energy may be lost. The lost energy may appear as undesirable noise commonly referred to as electromagnetic interference. When a high frequency AC signal changes layers 110 in printed circuit board 100, an impedance break may occur at the reference layer 110, e.g., layer 110B, nearest to the signal line, e.g., layer 110A. The impedance break may result in a large impedance difference increasing undesired electromagnetic interference.

In prior art printed circuit boards, electromagnetic interference may be reduced by placing a surface mount capacitor on the outside layer of the printed circuit board as illustrated in FIG. 1. A surface mount capacitor 140 may be mounted on the surface layer 110, e.g., layer 110A, of printed circuit board 100 to reduce the undesirable impedance of the reference path side of the transmission line. Typically, surface mount capacitor 140 may be placed near the bus or data path commonly referred to as the high frequency via 150, e.g., via 150A, where the input signal, i.e., source signal, travels from the top signal layer 110, i.e., layer 110A, to the bottom signal layer 110, i.e., layer 110F. By placing surface mount capacitor 140 near the high frequency via 150, i.e., via 150A, an AC low impedance path between reference layers 110B and 110E through surface mount capacitor 140 may be formed thereby reducing the electromagnetic interference generated.

As the frequency of the source signal increases the impedance of the vias 150, e.g., vias 150B–C, used to connect surface mount capacitor 140 between the reference layers 110, e.g., layers 110B, 110E, increases. As the impedance of the vias 150, e.g., vias 150B–C, increases, the impedance mismatch of the transmission line may be increased thereby creating electromagnetic interference. Subsequently, the frequency range of the input signal may be limited.

It would therefore be desirable to reduce the impedance within the reference path side of the high frequency transmission line. It would further be desirable to save space in the printed circuit board.

SUMMARY

The problems outlined above may at least in part be solved in some embodiments by embedding an electrical component within a via of the printed circuit board to reduce the impedance within the reference path and/or saving space within the printed circuit board.

In one embodiment, a printed circuit board comprises a plurality of conductive layers where one of the plurality of conductive layers is a first layer, e.g., top signal layer, and one of the plurality of conductive layers is a second layer, e.g., bottom signal layer. The printed circuit board further comprises two or more vias for interconnecting two or more conductive layers. One of the two or more vias is part of a signal path configured to carry a source signal from the first layer to the second layer. Furthermore, one of the two or more vias is part of a reference path configured to carry the source signal from a third layer to a fourth layer. The printed circuit board further comprises an electrical component embedded in the via that is part of the reference path between two conductive layers to reduce the impedance within the reference path.

In another embodiment of the present invention, a printed circuit board comprises a plurality of conductive layers. The printed circuit board further comprises two or more vias for interconnecting two or more conductive layers. The printed circuit board further comprises an electrical component embedded in a particular via between two conductive layers instead of placing the electrical component on the surface of the printed circuit board thereby saving space within the printed circuit board.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

A better understanding of the present invention can be obtained when the following detailed description is considered in conjunction with the following drawings, in which.

DETAILED DESCRIPTION

The present invention comprises a printed circuit board and method for suppressing the electromagnetic interference generated by an impedance mismatch in the transmission line and/or saving space within the printed circuit board. In one embodiment of the present invention, a printed circuit board comprises a plurality of conductive layers. The printed circuit board further comprises two or more vias for interconnecting two or more conductive layers. The printed circuit board further comprises an electrical component embedded in a particular via between two conductive layers to reduce the impedance within the reference path thereby reducing undesired electromagnetic interference and/or saving space within the printed circuit board.

Figure 2:
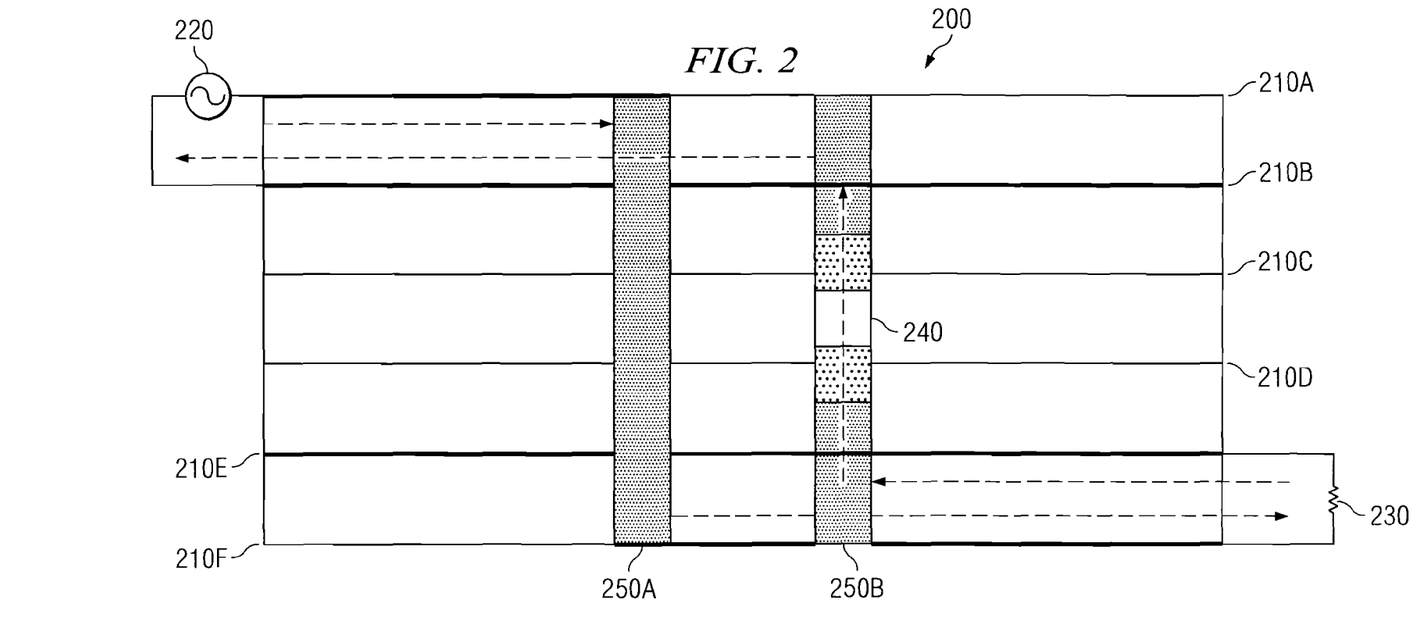
FIG. 2 illustrates an embodiment of a printed circuit board with an embedded electrical component configured in accordance with the present invention.

FIG. 2—Printed Circuit Board

FIG. 2 illustrates an embodiment of the present invention of a printed circuit board 200. As stated in the Background Information section, in prior art printed circuit boards, electromagnetic interference may be reduced by placing a surface mount capacitor near the high frequency via 150A (FIG. 1) and connected between reference layers, e.g., layers 110B, 110E (FIG. 1), as illustrated in FIG. 1. Referring to FIG. 1, the effectiveness of the surface mount capacitor may be limited by the impedance of the vias 150, e.g., 150B–C, used to connect surface mount capacitor 140 between reference layers 110, e.g., layers 110B, 110E. By limiting the effectiveness of surface mount capacitor 140, the frequency range of the input signal may be limited. It would therefore be desirable to reduce the impedance within the reference path. It would further be desirable to save space in the printed circuit board. Printed circuit board 200 comprises an embedded electrical component, e.g., capacitor, within a single via that forms part of the reference path to reduce the impedance on the reference path. By reducing the impedance on the reference path, the impedance mismatch of the transmission line may be reduced thereby reducing undesired electromagnetic interference. Furthermore, printed circuit board 200 illustrates that space may be saved by embedding an electrical component such as a two terminal electrical component, e.g., capacitor, resistor, inductor, diode, within a particular via instead of placing the electrical component on a surface layer of the printed circuit board.

Referring to FIG. 2, printed circuit board 200 comprises a plurality of conductive layers 210A–F. Printed circuit board 200 further comprises a plurality of vias 250A–B. Layers 210A–F may collectively or individually be referred to as layers 210 or layer 210, respectively. Vias 250A–B may collectively or individually be referred to as vias 250 or via 250, respectively. Printed circuit board 200 further comprises an internally embedded electrical component 240, e.g., capacitor, within a via 250, e.g., via 250B. It is noted that printed circuit board 200 may comprise any number of layers 210 and any number of vias 250 and that FIG. 2 is illustrative.

An input signal, e.g., high frequency Alternating Current (AC) signal, travels to a load 230 from a source 220 along a path commonly referred to as a transmission line. The transmission line may be formed from two separate conductive paths. The first conductive path, commonly referred to as the signal path, may be from the etch, i.e., trace, on the top signal layer 210, i.e., layer 210A, to the etch, i.e., trace, on the bottom signal layer 210, i.e., layer 210F, through via 250A of printed circuit board 200. The signal path may be a bus or a data path. It is noted that via 250A may commonly be referred to as the high frequency via 250. The high frequency via 250, i.e., via 250A, may be configured to carry the input signal from the top signal layer 210, i.e., layer 210A, to the bottom signal layer 210, i.e., layer 210F, as illustrated in FIG. 2. That is, layer 210A and layer 210F are electrically interconnected by having conductive material, e.g., copper, interconnect layer 210A with the high frequency via 250, i.e., via 250A, and interconnect layer 210F with the high frequency via 250, i.e., via 250A, as illustrated by the thick line in layer 210A and layer 210F that intersects with the high frequency via 250, i.e., via 250A.

The second conductive path of the transmission line, commonly referred to as the reference path, may be between the reference layers 210 nearest to the conductive signal path, i.e., path between layers 210E and 210B. The reference path may comprise the path from reference layer 210E to reference layer 210B through via 250, e.g., via 250B. Via 250B may be configured to carry the signal from reference layer 210E to reference layer 210B as illustrated in FIG. 2. That is, layer 210B and layer 210E are electrically interconnected by having conductive material, e.g., copper, interconnect layer 210B with via 250B and interconnect layer 210E with via 250B as illustrated by the thick line in layer 210B and layer 210E that intersects via 250B. It is noted that the reference path may be between any two reference layers 210 and that each reference layer 210 may be any layer 210 of printed circuit board 200.

As stated above, electrical component 240, e.g., capacitor, may be embedded within the via 250 that forms part of the reference path, e.g., via 250B, of the input signal, instead of mounting the electrical component, e.g., capacitor, on the surface layer of the printed circuit board thereby reducing the impedance within the reference path. By embedding electrical component 240, e.g., capacitor, within the via 250, e.g., via 250B, that forms part of the reference path instead of mounting the electrical component, e.g., capacitor, on a surface layer of the printed circuit board, the reference path is shortened in distance thereby reducing the impedance within the reference path part of the transmission line. That is, instead of the input signal traveling from layer 110E (FIG.

1) to layer 110A (FIG. 1) and then traveling through surface mount capacitor 140 (FIG. 1) as illustrated in FIG. 1, the input signal travels from layer 210E (FIG. 2) through electrical component 240, e.g., capacitor, to layer 210B (FIG. 2) as illustrated in FIG. 2. It is noted that electrical component 240, e.g., capacitor, may be embedded between any two separate conductive layers 210, e.g., layers 210A–F.

It is noted that the via 250 that forms part of the reference path of the input signal may be any via 250 except the via 250 designated as the high frequency via 250, e.g., via 250A. It is further noted that electrical component 240, e.g., capacitor, may be embedded in any via 250 of printed circuit board 200. It is further noted that in the preferred embodiment, electrical component 240, e.g., capacitor, is embedded in the via 250 that forms part of the reference path. It is further noted that in the preferred embodiment, the via 250 that forms part of the reference path is the via 250 adjacent to the via 250 designated as the high frequency via 250, e.g., via 250A, to maximize the suppression of electromagnetic interference.

As stated above, printed circuit board 200 illustrates that space may be saved by embedding an electrical component 240 such as a two terminal electrical component, e.g., capacitor, resistor, inductor, diode, within a via 250, e.g., via 250B, instead of placing the electrical component on the surface of the printed circuit board. It is noted for clarity that any two terminal electrical component, e.g., capacitor, resistor, inductor, diode, may be embedded within any via 250, e.g., via 250B, thereby saving space in the printed circuit board. However, only particular electrical components, e.g., capacitor, may be embedded in particular vias 250, e.g., via 250B, to reduce the impedance of the reference path part of the transmission line by effectively reducing the distance of the reference path. A more detailed description of embedding an electrical component 240 such as a two terminal electrical component, e.g., capacitor, resistor, inductor, diode, within a particular via 250, e.g., via 250B, is provided below.

Figure 3A:
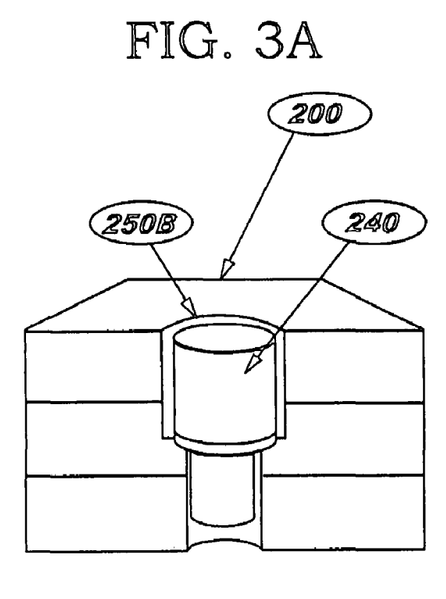
FIGS. 3A–C illustrate embodiments of the present invention of various configurations of the electrical component as well as the corresponding via where the electrical component may be embedded.
Figure 3B:
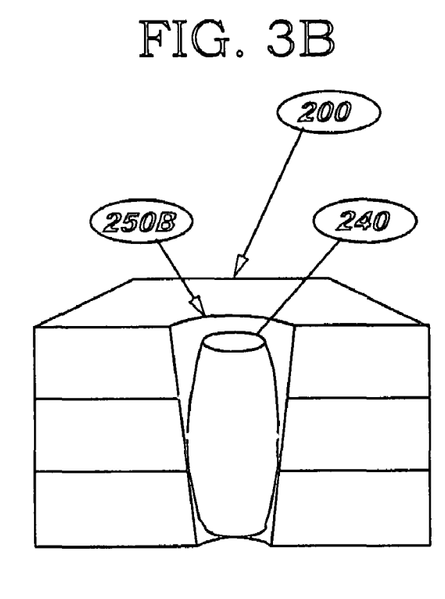
Figure 3C:
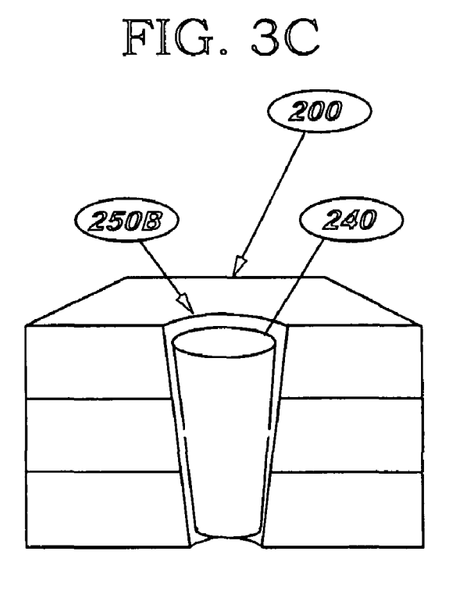

In one embodiment of the present invention, electrical component 240 such as a two terminal electrical component, e.g., capacitor, resistor, inductor, diode, embedded within printed circuit board 200 may be configured to match the configuration shape of the via 250 where electrical component 240 may be embedded. For example, an electrical component 240, e.g., capacitor, as well as the particular via 250, e.g., via 250B, where electrical component 240, e.g., capacitor, may be embedded may both be configured cylindrically as illustrated in FIG. 3A. In another embodiment, the center diameter of electrical component 240, e.g., capacitor, may be greater than at the outer ends of electrical component 240, e.g., capacitor, and the diameter of the particular via 250, e.g., 250B, where electrical component 240 may be the embedded may gradually change, e.g., decrease, from one end to the other end as illustrated in FIG. 3B. In another embodiment, the diameter of electrical component 240, e.g., capacitor, as well as the diameter of the particular via 250, e.g., via 250B, where the electrical component 240, e.g., capacitor, may be embedded may both gradually change, e.g., decrease, from one end to the other end as illustrated in FIG. 3C. Referring to FIGS. 3A–C, by adjusting the diameter of electrical component 240, e.g., capacitor, and the diameter of the particular via 250, e.g., via 250B, where electrical component 240, e.g., capacitor, may be embedded, the electrical component 240, e.g., capacitor, may be embedded between any two user designated conductive layers 210. That is, electrical component 240, e.g., capacitor, may be embedded between any two user designated conductive layers 210, e.g., layers 210A–F, in the via 250 that forms part of the reference path to suppress the impedance within the reference path. Electrical component 240 such as a two terminal electrical component, e.g., capacitor, resistor, inductor, diode, may be embedded between any two user designated conductive layers 210, e.g., layers 210A–F, in any via 250, e.g., via 250B, to save space in printed circuit 200. In another embodiment, electrical component 240 may be packaged as a pin where each end of electrical component 240 may be soldered to particular layers 210, e.g., layers 210E, 210B, of a particular via 250, e.g., via 250B.

Figure 4:
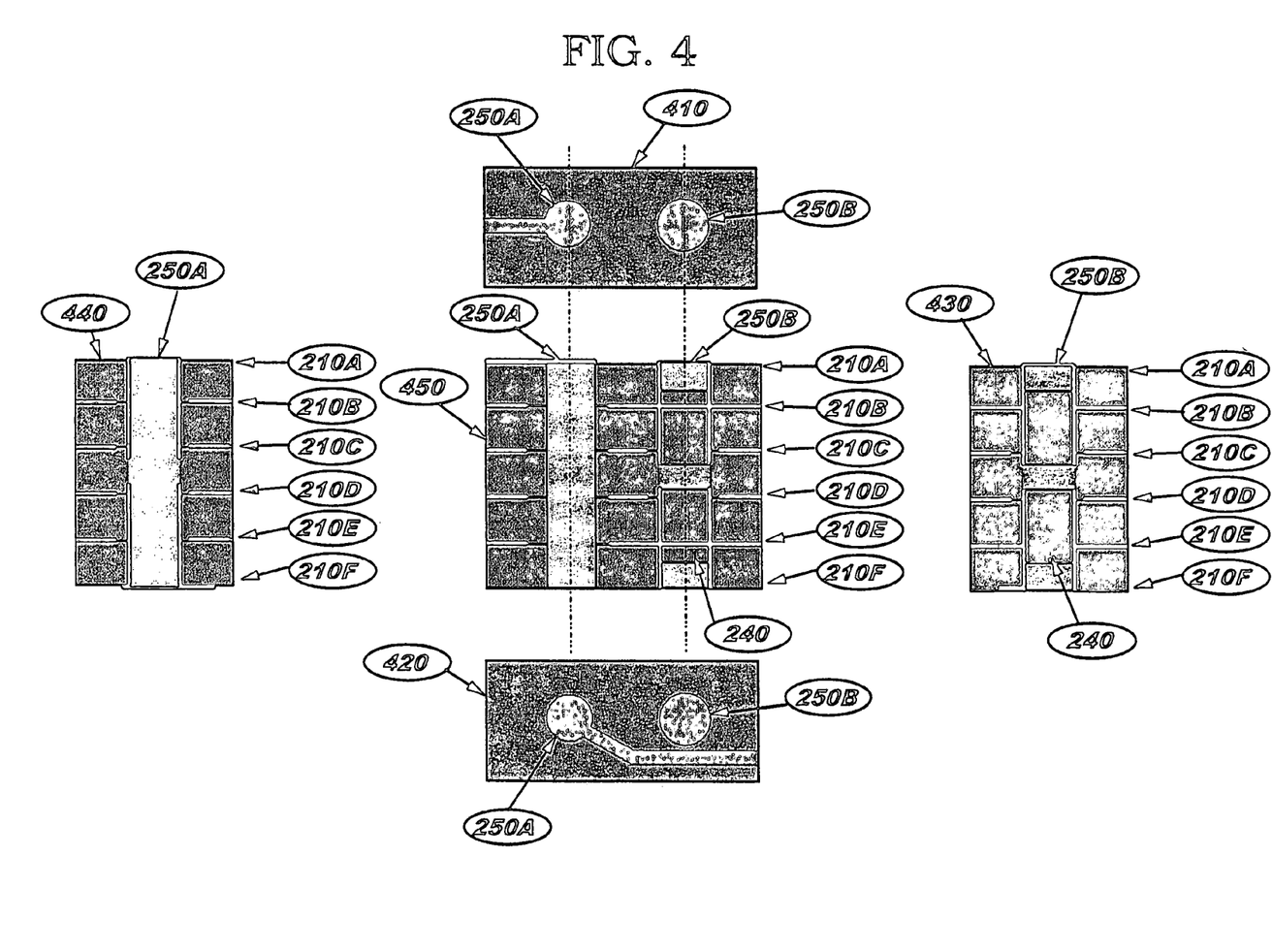
FIG. 4 illustrates various elevation and cross sectional views of the printed circuit board of FIG. 2.

FIG. 4—Perspective Views of Printed Circuit Board of FIG. 2

FIG. 4 illustrates various perspective views, e.g., top elevation view 410, bottom elevation view 420, cross sectional side view 430, cross sectional side view 440, cross sectional center view 450, of printed circuit board 200 of FIG. 2.

Top elevation view 410 of printed circuit board 200 illustrates that the high frequency via 250, i.e., via 250A, is interconnected to a trace on the top signal layer, i.e., layer 210A, whereas via 250B is not interconnected to any traces on the top signal layer, i.e., layer 210A. Bottom elevation view 410 of printed circuit board 200 illustrates that the high frequency via 250, i.e., via 250A, is interconnected to a trace on the bottom signal layer, i.e., layer 210F, whereas via 250B is not interconnected to any traces on the bottom signal layer, i.e., layer 210F.

Cross sectional side view 430 of printed circuit board 200 illustrates an embodiment of electrical component 240 such as a two terminal electrical component, e.g., capacitor, resistor, inductor, diode, configured with a central diameter that is greater than the diameter at the outer ends of electrical component 240 (as illustrated in FIG. 3B). Furthermore, each end of electrical component 240 may have a conductive cap that is tinned, i.e., covering conductive cap with a tin alloy. By having each end of electrical component 240 tinned, solder residue sticks to the end of electrical component 240 that is tinned. Since the central diameter of electrical component 240 is greater than the outer ends of electrical component 240, solder residue may be prevented from flowing around the center of electrical component 240 thereby preventing the shorting of electrical component 240. Furthermore, side view 430 of printed circuit board 200 illustrates via 250B interconnected to layer 210B and layer 210E as illustrated by the thick lines intersecting via 250B at layers 210B and 210E. It is noted that via 250B may be interconnected between any two separate conductive layers 210, e.g., layers 210A–F.

Cross sectional side view 440 of printed circuit board 200 illustrates high frequency via 250, e.g., via 250A, connected to the top signal layer 210, i.e., layer 210A, and bottom signal layer 210, i.e., layer 210F. In cross sectional side view 440 of printed circuit board 200, high frequency via 250, e.g., via 250A, is not connected to any other layers 210 as illustrated by the absence of thick lines intersecting via 250A at any of the internal conductive layers 210, i.e., layers 210B–E.

Cross sectional central view 450 of printed circuit board 200 illustrates that high frequency via 250, e.g., via 250A, is interconnected to the top signal layer, i.e., layer 210A, and to the bottom signal layer, i.e., layer 210F. Cross sectional central view 450 of printed circuit board 200 further illustrates an electrical component 240 such as a two terminal electrical component, e.g., capacitor, resistor, inductor, diode, embedded within via 250B. Electrical component 240 may be packaged as a pin where each end of electrical component 240 may be soldered to particular internal layers 210 of via 250B.

Figure 5:
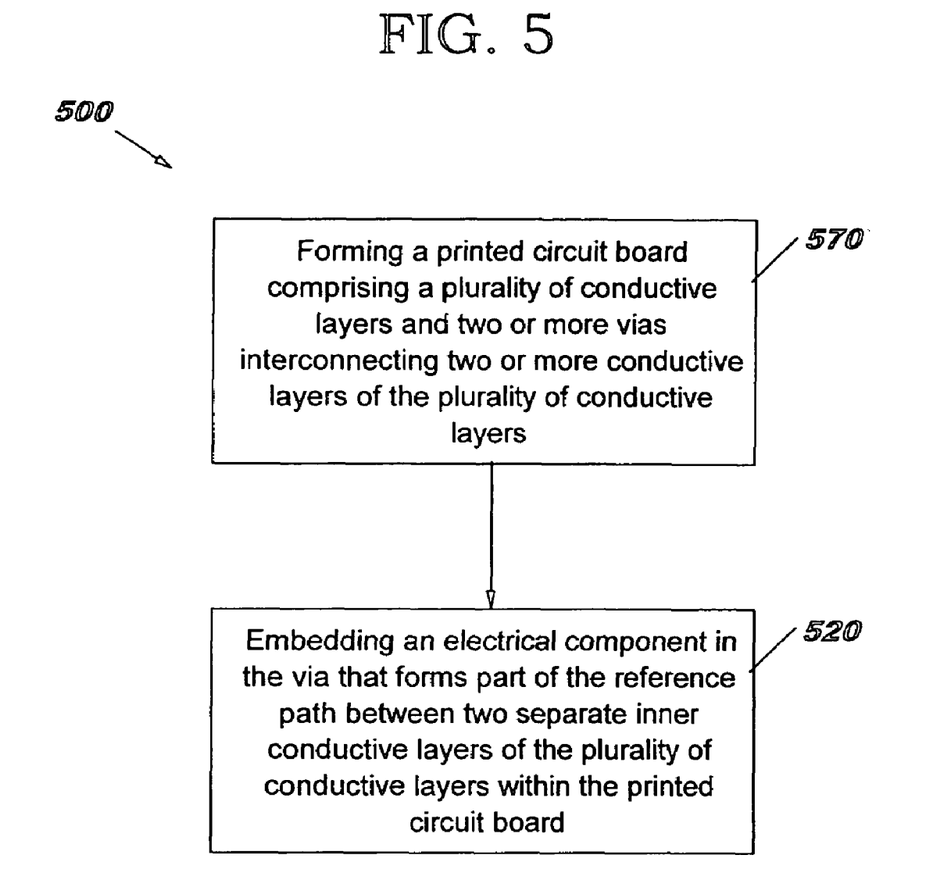
FIG. 5 is a flowchart of a method for reducing the impedance within the reference path in a printed circuit board.

FIG. 5—Method for Reducing Impedance within Reference Path in a Printed Circuit Board FIG. 5 illustrates a method 500 according to an embodiment of the present invention. Method 500 is a method for reducing the impedance within the reference path in a printed circuit board.

In step 510, a printed circuit board 200 may be formed comprising a plurality of conductive layers 210A–F where one of the plurality of conductive layers is a top signal layer 210, i.e., layer 210A, and another one of the plurality of conductive layers is a bottom signal layer 210, i.e., layer 210F. It is noted that printed circuit board 200 may comprise any number of layers 210. Furthermore, printed circuit board 200 may comprise two or more vias 250, e.g., vias 250A–B, interconnecting two or more conductive layers 210. One of the two or more vias 250 may be part of a signal path, e.g., via 250A, configured to carry a source signal from the top signal layer, i.e., layer 210A, to the bottom signal layer, i.e., layer 210F. Furthermore, one of the two or more vias 250 may be part of a reference path, e.g., via 250B, configured to carry the source signal from one of the conductive layers 210, e.g., layer 210E, to another conductive layer 210, e.g., layer 210B. It is noted that the reference path may be between any two reference layers 210 and that each reference layer 210 may be any layer 210 of printed circuit board 200. It is further noted that the via 250, e.g., via 250B, that is part of the reference path may be configured to carry the source signal from and to different conductive layers 210, e.g., layers 210A–F. For example, if load 230 of FIG. 2 were coupled between the ground plate 210F and layer 210D, then the via 250, e.g., via 250B, that is part of the reference path may be configured to carry the source signal from layer 210D to layer 210B.

In step 520, an electrical component 240, e.g., capacitor, may be positioned, i.e., embedded, in a particular via 250, e.g., via 250B, to reduce the impedance within the reference path portion of the transmission line. In the preferred embodiment, electrical component 240, e.g., capacitor, may be embedded within the via 250, e.g., via 250B, adjacent to the via 250 designated as the high frequency via 250, e.g., via 250A, to maximize the effect of reducing the impedance within the reference path in printed circuit board 200. In one embodiment of the present invention, the electrical component 240, e.g., capacitor, may be configured to match the configuration shape of the via 250 where electrical component 240 may be embedded. For example, an electrical component 240, e.g., capacitor, as well as the particular via 250, e.g., via 250B, where electrical component 240, e.g., capacitor, may be embedded may both be configured cylindrically as illustrated in FIG. 3A. In another embodiment, the center diameter of electrical component 240, e.g., capacitor, may be greater than at the outer ends of electrical component 240, e.g., capacitor, and the diameter of the particular via 250, e.g., 250B, where electrical component 240 may be the embedded may gradually change, e.g., decrease, from one end to the other end as illustrated in FIG. 3B. In another embodiment, the diameter of electrical component 240, e.g., capacitor, as well as the diameter of the particular via 250, e.g., via 250B, where the electrical component 240, e.g., capacitor, may be embedded may both gradually change, e.g., decrease, from one end to the other end as illustrated in FIG. 3C. Referring to FIGS. 3A–C, by adjusting the diameter of electrical component 240, e.g., capacitor, and the diameter of the particular via 250, e.g., via 250B, where electrical component 240, e.g., capacitor, may be embedded, the electrical component 240, e.g., capacitor, may be embedded between any two user designated conductive layers 210. That is, electrical component 240, e.g., capacitor, may be embedded between any two user designated conductive layers 210, e.g., layers 210A–F, in the via 250 that forms part of the reference path to suppress the impedance within the reference path. In another embodiment, electrical component 240 may be packaged as a pin where each end of electrical component 240 may be soldered to particular layers 210, e.g., layer 210E and layer 210B, of a particular via 250, e.g., via 250B.

Figure 6:
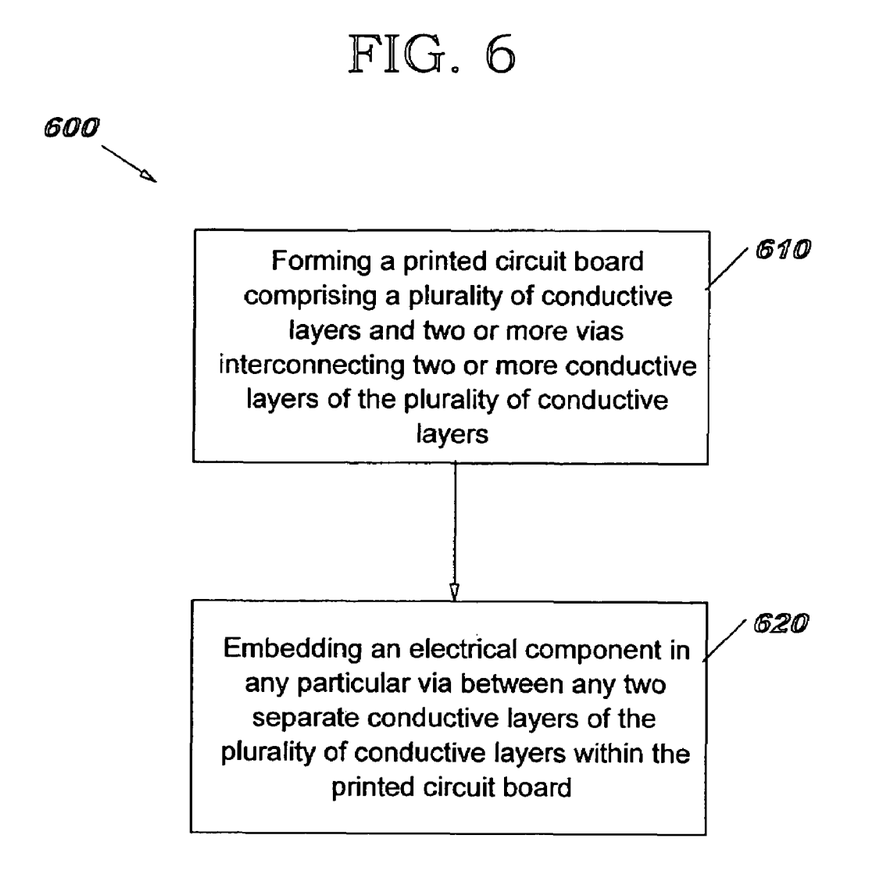
FIG. 6 is a flowchart of a method for saving space in a printed circuit board.

FIG. 6—Method for Saving Space in a Printed Circuit Board.

FIG. 6 illustrates a method 600 according to an embodiment of the present invention. Method 600 is a method for saving space in a printed circuit board.

In step 610, a printed circuit board 200 may be formed comprising a plurality of conductive layers 210A–F, where one of the plurality of conductive layers is a top signal layer, i.e., layer 210A, and another one of the plurality of conductive layers is a bottom signal layer, i.e., layer 210F. It is noted that printed circuit board 200 may comprise any number of layers 210. Furthermore, printed circuit board 200 may comprise two or more vias 250, e.g., vias 250A–B, interconnecting two or more conductive layers 210.

In step 620, an electrical component 240 such as a two terminal electrical component, e.g., capacitor, resistor, inductor, diode, may be positioned, i.e., embedded, in any via 250, e.g., via 250B, instead of placing the electrical component on the surface of the printed circuit board. In one embodiment, electrical component 240 such as a two terminal electrical component, e.g., capacitor, resistor, inductor, diode, may be configured to match the configuration shape of the particular via 250, e.g., via 250B, where the electrical component 240 may be embedded. For example, an electrical component 240 as well as the particular via 250, e.g., via 250B, where electrical component 240 may be embedded may both be configured cylindrically as illustrated in FIG. 3A. In another embodiment, the center diameter of electrical component 240, e.g., capacitor, may be greater than at the outer ends of electrical component 240 and the diameter of the particular via 250, e.g., 250B, where electrical component 240 may be the embedded may gradually change, e.g., decrease, from one end to the other end as illustrated in FIG. 3B. In another embodiment, the diameter of electrical component 240 as well as the diameter of the particular via 250, e.g., via 250B, where the electrical component 240 may be embedded may both gradually change, e.g., decrease, from one end to the other end as illustrated in FIG. 3C. Referring to FIGS. 3A–C, by adjusting the diameter of electrical component 240 and the diameter of the particular via 250, e.g., via 250B, where electrical component 240 may be embedded, the electrical component 240 may be embedded between any two user designated conductive layers 210. That is, electrical component 240 such as a two terminal electrical component, e.g., capacitor, resistor, inductor, diode, may be embedded between any two user designated conductive layers 210, e.g., layers 210A–F, in any via 250, e.g., via 250B, to save space in printed circuit 200. In another embodiment, electrical component 240 such as a two terminal electrical component, e.g., capacitor, resistor, inductor, diode, may be packaged as a pin where each end of electrical component 240 may be soldered between any two conductive layers 210, e.g., layers 210A–F, of a particular via 250, e.g., via 250B. It is noted that electrical component 240 may extended beyond printed circuit board 200 as long as it may be soldered to the desired conductive layers 210.

Although the printed circuit board and method are described in connection with several embodiments, it is not intended to be limited to the specific forms set forth herein, but on the contrary, it is intended to cover such alternatives, modifications, and equivalents, as can be reasonably included within the spirit and scope of the invention as defined by the appended claims. It is noted that the headings are used only for organizational purposes and not meant to limit the scope of the description or claims.

The invention claimed is:

1. A method for saving space in a printed circuit board comprising the steps of:

forming said printed circuit board comprising a plurality of conductive layers, wherein said printed circuit board further comprises two or more vias interconnecting two or more conductive layers of said plurality of conductive layers; and embedding an electrical component in a particular via between two conductive layers of said plurality of conductive layers, wherein said electrical component has a greater diameter in a center than at ends, and each end of the electrical component has a tinned cap to promote solder residue adhesion to each end of the electrical component.

2. The method as recited in claim 1, wherein said electrical component is a two terminal electrical component.

3. The method as recited in claim 1, wherein said electrical component is a capacitor.

4. The method as recited in claim 1, wherein said electrical component is a resistor.

5. The method as recited in claim 1, wherein said electrical component is an inductor.

6. The method as recited in claim 1, wherein said electrical component is a diode.

7. The method as recited in claim 1, wherein said electrical component has a cylindrical configuration.

8. The method as recited in claim 1, wherein a diameter from one end of said electrical component changes to an other end of said electrical component, wherein said particular via is configured so that one end of the said particular via changes in diameter to an other end of said particular via.

9. The method as recited in claim 8, wherein said electrical component is embedded between two conductive layers of said plurality of conductive layers by adjusting the diameter of said electrical component of said particular via.

10. The method as recited in claim 1, wherein said electrical component is packaged as a pin, wherein each end of said electrical component is soldered to said two conductive layers of said plurality of conductive layers.

* * * * *